US008597831B2

(12) United States Patent
Green et al.

(10) Patent No.: US 8,597,831 B2
(45) Date of Patent: Dec. 3, 2013

(54) METHOD OF FABRICATING FIBRES COMPOSED OF SILICON OR A SILICON-BASED MATERIAL AND THEIR USE IN LITHIUM RECHARGEABLE BATTERIES

(75) Inventors: Mino Green, London (GB); Feng-Ming Liu, Reading (GB)

(73) Assignee: Nexeon Ltd., Oxfordshire (GB)

( * ) Notice: Subject to any disclaimer, the term of this patent is extended or adjusted under 35 U.S.C. 154(b) by 0 days.

(21) Appl. No.: 13/286,740

(22) Filed: Nov. 1, 2011

(65) Prior Publication Data

US 2012/0100427 A1   Apr. 26, 2012

Related U.S. Application Data

(63) Continuation of application No. 12/161,126, filed as application No. PCT/GB2007/000211 on Jan. 23, 2007, now Pat. No. 8,101,298.

(30) Foreign Application Priority Data

Jan. 23, 2006   (GB) .................................. 0601319.7

(51) Int. Cl.
 *H01M 4/38* (2006.01)
(52) U.S. Cl.
 USPC ...................................................... 429/218.1
(58) Field of Classification Search
 None
 See application file for complete search history.

(56) References Cited

U.S. PATENT DOCUMENTS

| | | |
|---|---|---|
| 3,351,445 A | 11/1967 | Fielder et al. |
| 4,002,541 A | 1/1977 | Streander |
| 4,436,796 A | 3/1984 | Huggins et al. |
| 4,950,566 A | 8/1990 | Huggins et al. |
| 5,260,148 A | 11/1993 | Idota |
| 5,262,021 A | 11/1993 | Lehmann et al. |
| 5,660,948 A | 8/1997 | Barker |
| 5,907,899 A | 6/1999 | Dahn et al. |
| 5,980,722 A | 11/1999 | Kuroda et al. |
| 6,022,640 A | 2/2000 | Takada et al. |
| 6,042,969 A | 3/2000 | Yamada et al. |
| 6,063,995 A | 5/2000 | Bohland et al. |
| 6,235,427 B1 | 5/2001 | Idota et al. |
| 6,296,969 B1 | 10/2001 | Yano et al. |
| 6,334,939 B1 | 1/2002 | Zhou et al. |
| 6,337,156 B1 | 1/2002 | Narang et al. |

(Continued)

FOREIGN PATENT DOCUMENTS

| | | |
|---|---|---|
| CN | 101442124 A | 5/2009 |
| DE | 199 22 257 A1 | 11/2000 |

(Continued)

OTHER PUBLICATIONS

Qiu, From Si nanotubes to nanowires: Synthesis, characterization, and self-assembly, Mar. 7, 2005, Journal of Crystal Growth, 277, 143-148.*

(Continued)

*Primary Examiner* — Ula C Ruddock
*Assistant Examiner* — Daniel Gatewood
(74) *Attorney, Agent, or Firm* — Fay Sharpe LLP

(57) ABSTRACT

An electrically interconnected mass includes elongated structures. The elongated structures are electrochemically active and at least some of the elongated structures cross over each other to provide intersections and a porous structure. The elongated structures include doped silicon.

25 Claims, 3 Drawing Sheets

(56) References Cited

U.S. PATENT DOCUMENTS

| | | |
|---|---|---|
| 6,353,317 B1 | 3/2002 | Green et al. |
| 6,399,177 B1 | 6/2002 | Fonash et al. |
| 6,399,246 B1 | 6/2002 | Vandayburg et al. |
| 6,589,696 B2 | 7/2003 | Matsubara et al. |
| 6,605,386 B1 | 8/2003 | Kasamatsu et al. |
| 6,620,547 B1 | 9/2003 | Sung et al. |
| 6,887,511 B1 | 5/2005 | Shima et al. |
| 6,916,679 B2 | 7/2005 | Snyder et al. |
| 7,033,936 B1 | 4/2006 | Green |
| 7,051,945 B2 | 5/2006 | Empedocles et al. |
| 7,070,632 B1 | 7/2006 | Visco et al. |
| 7,094,499 B1 | 8/2006 | Hung |
| 7,147,894 B2 | 12/2006 | Zhou et al. |
| 7,192,673 B1 | 3/2007 | Ikeda et al. |
| 7,311,999 B2 | 12/2007 | Kawase et al. |
| 7,318,982 B2 | 1/2008 | Gozdz et al. |
| 7,348,102 B2 | 3/2008 | Li et al. |
| 7,358,011 B2 | 4/2008 | Fukuoka et al. |
| 7,378,041 B2 | 5/2008 | Asao et al. |
| 7,425,285 B2 | 9/2008 | Asao et al. |
| 7,476,469 B2 | 1/2009 | Ota et al. |
| 7,569,202 B2 | 8/2009 | Farrell et al. |
| 7,659,034 B2 | 2/2010 | Minami et al. |
| 7,674,552 B2 | 3/2010 | Nakai et al. |
| 7,767,346 B2 | 8/2010 | Kim et al. |
| 7,862,933 B2 | 1/2011 | Okumura et al. |
| 8,034,485 B2 | 10/2011 | Dehn et al. |
| 2001/0023986 A1 | 9/2001 | Mancevski |
| 2002/0121460 A1* | 9/2002 | Moy et al. .............. 208/133 |
| 2002/0148727 A1* | 10/2002 | Zhou et al. .............. 204/409 |
| 2003/0135989 A1 | 7/2003 | Huggins et al. |
| 2004/0072067 A1 | 4/2004 | Minami et al. |
| 2004/0126659 A1 | 7/2004 | Graetz et al. |
| 2004/0151987 A1 | 8/2004 | Kawase et al. |
| 2004/0185346 A1 | 9/2004 | Takeuchi et al. |
| 2004/0197660 A1 | 10/2004 | Sheem et al. |
| 2004/0214085 A1 | 10/2004 | Sheem et al. |
| 2004/0224231 A1 | 11/2004 | Fujimoto et al. |
| 2004/0241548 A1 | 12/2004 | Nakamoto et al. |
| 2005/0042515 A1 | 2/2005 | Hwang et al. |
| 2005/0079414 A1 | 4/2005 | Yamamoto et al. |
| 2005/0079420 A1 | 4/2005 | Cho et al. |
| 2005/0118503 A1 | 6/2005 | Honda et al. |
| 2005/0191550 A1 | 9/2005 | Satoh et al. |
| 2005/0193800 A1 | 9/2005 | DeBoer et al. |
| 2005/0214644 A1 | 9/2005 | Aramata et al. |
| 2006/0003226 A1 | 1/2006 | Sawa et al. |
| 2006/0019115 A1 | 1/2006 | Wang et al. |
| 2006/0019168 A1 | 1/2006 | Li et al. |
| 2006/0024582 A1 | 2/2006 | Li et al. |
| 2006/0051670 A1 | 3/2006 | Aramata et al. |
| 2006/0057463 A1 | 3/2006 | Gao et al. |
| 2006/0088767 A1 | 4/2006 | Li et al. |
| 2006/0097691 A1 | 5/2006 | Green |
| 2006/0134516 A1 | 6/2006 | Im et al. |
| 2006/0134518 A1 | 6/2006 | Kogetsu et al. |
| 2006/0147800 A1 | 7/2006 | Sato et al. |
| 2006/0154071 A1 | 7/2006 | Homma et al. |
| 2006/0166093 A1 | 7/2006 | Zaghib et al. |
| 2006/0175704 A1 | 8/2006 | Shimizu et al. |
| 2006/0257307 A1 | 11/2006 | Yang |
| 2006/0263687 A1 | 11/2006 | Leitner et al. |
| 2006/0275663 A1 | 12/2006 | Matsuno et al. |
| 2006/0275668 A1 | 12/2006 | Peres et al. |
| 2006/0286448 A1 | 12/2006 | Snyder et al. |
| 2007/0026313 A1 | 2/2007 | Sano |
| 2007/0031733 A1 | 2/2007 | Kogetsu et al. |
| 2007/0037063 A1 | 2/2007 | Choi et al. |
| 2007/0048609 A1 | 3/2007 | Yeda et al. |
| 2007/0059598 A1 | 3/2007 | Yang |
| 2007/0065720 A1 | 3/2007 | Hasegawa et al. |
| 2007/0072074 A1 | 3/2007 | Yamamoto et al. |
| 2007/0087268 A1 | 4/2007 | Kim et al. |
| 2007/0099084 A1 | 5/2007 | Huang et al. |
| 2007/0099085 A1 | 5/2007 | Choi et al. |
| 2007/0105017 A1 | 5/2007 | Kawase et al. |
| 2007/0117018 A1 | 5/2007 | Huggins |
| 2007/0122702 A1 | 5/2007 | Sung et al. |
| 2007/0148544 A1 | 6/2007 | Le |
| 2007/0172732 A1 | 7/2007 | Jung et al. |
| 2007/0184345 A1 | 8/2007 | Neudecker et al. |
| 2007/0190413 A1 | 8/2007 | Lee et al. |
| 2007/0202395 A1 | 8/2007 | Snyder et al. |
| 2007/0202402 A1 | 8/2007 | Asahina et al. |
| 2007/0207080 A1 | 9/2007 | Yang |
| 2007/0207385 A1 | 9/2007 | Liu et al. |
| 2007/0209584 A1 | 9/2007 | Kalynushkin et al. |
| 2007/0212538 A1 | 9/2007 | Niu |
| 2007/0218366 A1 | 9/2007 | Kalynushkin et al. |
| 2007/0224508 A1 | 9/2007 | Aramata et al. |
| 2007/0224513 A1 | 9/2007 | Kalynushkin et al. |
| 2007/0238021 A1 | 10/2007 | Liu et al. |
| 2007/0243469 A1 | 10/2007 | Kim et al. |
| 2007/0264564 A1 | 11/2007 | Johnson et al. |
| 2007/0264574 A1 | 11/2007 | Kim et al. |
| 2007/0269718 A1 | 11/2007 | Krause et al. |
| 2007/0277370 A1 | 12/2007 | Kalynushkin et al. |
| 2008/0003496 A1 | 1/2008 | Neudecker et al. |
| 2008/0003503 A1 | 1/2008 | Kawakami et al. |
| 2008/0020281 A1 | 1/2008 | Kogetsu et al. |
| 2008/0038638 A1 | 2/2008 | Zhang et al. |
| 2008/0090149 A1 | 4/2008 | Sano et al. |
| 2008/0096110 A1 | 4/2008 | Bito et al. |
| 2008/0107967 A1 | 5/2008 | Liu et al. |
| 2008/0113271 A1 | 5/2008 | Ueda et al. |
| 2008/0118834 A1 | 5/2008 | Yew et al. |
| 2008/0124631 A1 | 5/2008 | Fukui et al. |
| 2008/0131782 A1 | 6/2008 | Hagiwara et al. |
| 2008/0138710 A1 | 6/2008 | Liaw et al. |
| 2008/0138716 A1 | 6/2008 | Iwama et al. |
| 2008/0145752 A1 | 6/2008 | Hirose et al. |
| 2008/0145759 A1 | 6/2008 | Sung et al. |
| 2008/0160415 A1 | 7/2008 | Wakita et al. |
| 2008/0176139 A1 | 7/2008 | White et al. |
| 2008/0206631 A1 | 8/2008 | Christensen et al. |
| 2008/0206641 A1 | 8/2008 | Christensen et al. |
| 2008/0233479 A1 | 9/2008 | Sung et al. |
| 2008/0233480 A1 | 9/2008 | Sung et al. |
| 2008/0241647 A1 | 10/2008 | Fukui et al. |
| 2008/0241703 A1 | 10/2008 | Yamamoto et al. |
| 2008/0248250 A1 | 10/2008 | Flemming et al. |
| 2008/0261112 A1 | 10/2008 | Nagata et al. |
| 2008/0305391 A1 | 12/2008 | Hirose et al. |
| 2009/0053589 A1 | 2/2009 | Obrovac et al. |
| 2009/0078982 A1 | 3/2009 | Rachmady et al. |
| 2009/0087731 A1 | 4/2009 | Fukui et al. |
| 2009/0101865 A1 | 4/2009 | Matsubara et al. |
| 2009/0117466 A1 | 5/2009 | Zhamu et al. |
| 2009/0166319 A1 | 7/2009 | Courboin et al. |
| 2009/0186267 A1 | 7/2009 | Tiegs |
| 2009/0239151 A1 | 9/2009 | Nakanishi et al. |
| 2009/0253033 A1 | 10/2009 | Hirose et al. |
| 2009/0269677 A1 | 10/2009 | Hirose et al. |
| 2009/0305129 A1 | 12/2009 | Fukui et al. |
| 2010/0085685 A1 | 4/2010 | Pinwill |
| 2010/0092868 A1 | 4/2010 | Kim et al. |
| 2010/0124707 A1 | 5/2010 | Hirose et al. |
| 2010/0136437 A1 | 6/2010 | Nishida et al. |
| 2010/0285358 A1 | 11/2010 | Cui et al. |
| 2010/0297502 A1 | 11/2010 | Zhu et al. |
| 2010/0330419 A1 | 12/2010 | Cui et al. |

FOREIGN PATENT DOCUMENTS

| | | |
|---|---|---|
| DE | 103 47 570 A1 | 5/2005 |
| EP | 0 281 115 | 9/1988 |
| EP | 0 553 465 A1 | 8/1993 |
| EP | 0 820 110 A2 | 1/1998 |
| EP | 1 011 160 A1 | 6/2000 |
| EP | 1011160 A1 * | 6/2000 |
| EP | 0 936 687 B1 | 12/2001 |
| EP | 1 231 653 A1 | 8/2002 |
| EP | 1 231 654 A1 | 8/2002 |
| EP | 1 258 937 A1 | 11/2002 |

(56) References Cited

FOREIGN PATENT DOCUMENTS

| | | |
|---|---|---|
| EP | 1 083 614 B1 | 5/2003 |
| EP | 1 313 158 A2 | 5/2003 |
| EP | 1 335 438 A1 | 8/2003 |
| EP | 1 289 045 B1 | 3/2006 |
| EP | 1 657 769 A1 | 5/2006 |
| EP | 1 850 409 A1 | 10/2007 |
| EP | 1 771 899 B1 | 2/2008 |
| EP | 1 657 768 B1 | 5/2008 |
| EP | 2 058 882 | 5/2009 |
| EP | 2 204 868 A3 | 7/2010 |
| FR | 2 885 913 B1 | 8/2007 |
| GB | 0 980 513 | 1/1965 |
| GB | 1 014 706 | 12/1965 |
| GB | 2 395 059 A | 5/2004 |
| GB | 2 464 157 B | 1/2010 |
| GB | 2 464 158 | 4/2010 |
| JP | 02-209492 A | 8/1990 |
| JP | 06-283156 | 10/1994 |
| JP | 10-046366 | 2/1998 |
| JP | 10-083817 | 3/1998 |
| JP | 10-199524 | 7/1998 |
| JP | 2000-003727 | 1/2000 |
| JP | 2000-173594 | 6/2000 |
| JP | 2000-348730 A | 12/2000 |
| JP | 2001-291514 | 10/2001 |
| JP | 2002-279974 A | 9/2002 |
| JP | 2002-313319 A | 10/2002 |
| JP | 2003-017040 | 1/2003 |
| JP | 2003-168426 | 6/2003 |
| JP | 04-607488 | 2/2004 |
| JP | 2004-071305 | 3/2004 |
| JP | 2004-095264 | 3/2004 |
| JP | 2004-214054 | 7/2004 |
| JP | 2004-281317 | 10/2004 |
| JP | 2004-296386 A | 10/2004 |
| JP | 2004-533699 A | 11/2004 |
| JP | 2005-310759 A | 11/2005 |
| JP | 2006-505901 A | 2/2006 |
| JP | 2006-276214 A | 10/2006 |
| JP | 2006-290938 A | 10/2006 |
| JP | 2006-335410 A | 12/2006 |
| JP | 2007-165079 A | 6/2007 |
| JP | 2008-034266 | 2/2008 |
| JP | 2008-186732 | 8/2008 |
| JP | 2008-204988 | 10/2008 |
| JP | 2009-252348 A | 10/2009 |
| KR | 2007-023141 | 2/2007 |
| KR | 2007-0110569 A | 11/2007 |
| KR | 2008-038806 A | 5/2008 |
| NL | 1015956 | 8/2000 |
| SU | 471402 | 5/1975 |
| SU | 544019 | 1/1977 |
| WO | WO 99/33129 | 7/1999 |
| WO | WO 01/13414 A1 | 2/2001 |
| WO | WO 01/35473 A1 | 5/2001 |
| WO | WO 01/96847 A1 | 12/2001 |
| WO | WO 02/25356 A2 | 3/2002 |
| WO | WO 02/47185 A2 | 6/2002 |
| WO | WO 03/063271 A1 | 7/2003 |
| WO | WO 03/075372 A2 | 9/2003 |
| WO | WO 2004/042851 A2 | 5/2004 |
| WO | WO 2004/052489 A2 | 6/2004 |
| WO | WO 2004/083490 A2 | 9/2004 |
| WO | WO 2005/011030 A1 | 2/2005 |
| WO | WO 2005/113467 A1 | 12/2005 |
| WO | WO 2005/119753 A2 | 12/2005 |
| WO | WO 2006/067891 A1 | 6/2006 |
| WO | WO 2006/073427 A2 | 7/2006 |
| WO | WO 2006/120332 A2 | 11/2006 |
| WO | WO 2007/044315 A1 | 4/2007 |
| WO | WO 2007/083152 A1 | 7/2007 |
| WO | WO 2007/083155 | 7/2007 |
| WO | WO 2007/114168 A1 | 10/2007 |
| WO | WO 2007/136164 A1 | 11/2007 |
| WO | WO 2008/029888 A1 | 3/2008 |
| WO | WO 2008/044683 A1 | 4/2008 |
| WO | WO 2008/072460 A1 | 6/2008 |
| WO | WO 2008/097723 A1 | 8/2008 |
| WO | WO 2008/139157 A1 | 11/2008 |
| WO | WO 2009/010757 | 1/2009 |
| WO | WO 2009/010758 | 1/2009 |
| WO | WO 2009/010759 | 1/2009 |
| WO | WO 2009/026466 | 2/2009 |
| WO | WO 2009/120404 A1 | 10/2009 |
| WO | WO 2009/128800 | 10/2009 |
| WO | WO 2010/040985 | 4/2010 |
| WO | WO 2010/040986 | 4/2010 |
| WO | WO 2010/060348 A1 | 6/2010 |
| WO | WO 2010/130975 A1 | 11/2010 |
| WO | WO 2010/130976 A1 | 11/2010 |

OTHER PUBLICATIONS

Peng, Fabrication of single-crystalline silicon nanowires by scratching a silicon surface with catalytic metal particles, 2006, Advanced Functional Materials, 16, 387-394.*

Badel et al., "Formation of Ordered Pore Arrays at the Nanoscale by Electrochemical Etching of N-Type Silicon", Superlattices and Microstructures, 36 (2004) 245-253.

Barraclough et al., "Cold Compaction of Silicon Powders Without a Binding Agent", Materials Letters 61 (2007) 485-487.

Beaulieu et al., "Colossal Reversible Volume Changes in Lithium Alloys", Electrochemical and Solid-State Letters, 4 (9) (2001) A137-A140.

Beaulieu et al., "Reaction of Li with Grain-Boundary Atoms in Nanostructured Compounds", Journal of The Electrochemical Society, 147 (9) (2000) 3206-3212.

Besenhard et al., "Will Advanced Lithium-Alloy Anodes Have a Chance in Lithium-Ion Batteries?", Journal of Power Sources, 68 (1997) 87-90.

Boukamp et al., "All-Solid Lithium Electrodes with Mixed-Conductor Matrix", J. Electrochem. Soc.: Electrochemical Science and Technology, vol. 128, No. 4, (1981) 725-729.

Bourderau, et al., "Amorphous Silicon as a Possible Anode Material for Li-Ion Batteries", Journal of Power Sources, 81-82 (1999) 233-236.

Canham, L. T., "Diffusion of Li IN Si", Properties of Silicon, EMIS Datareviews Series No. 4 (1987) 454-462.

Chan et al., "Surface Chemistry and Morphology of the Solid Electrolyte Interphase on Silicon Nanowire Lithium-Ion Battery Anodes", Journal of Power Sources, 189(2), 1132-1140, (2009).

Chang et al., "Ultrafast Growth of Single-Crystalline Si Nanowires", Materials Letters, 60 (2006) 2125-2128.

Chen et al., Binder Effect on Cycling Performance of Silicon/Carbon Composite Anodes for Lithium Ion Batteries, 36 (2006) 1099-1104.

Chen et al., "Effect of Vinylene Carbonate (VC) as Electrolyte Additive on Electrochemical Performance of Si Film Anode for Lithium Ion Batteries", Journal of Power Sources, 174(2), 538-543, (2007).

Chen et al., "Selective Etching of Silicon in Aqueous Ammonia Solution", Sensors and Actuators, A 49 (1995) 115-121.

Chevrier et al., "Methods for Successful Cycling of Alloy Negative Electrodes in Li-Ion Cells", 220th ECS Meeting, Abstract #1237 (2011).

Choi et al., "Effect of Fluoroethylene Carbonate Additive on Interfacial Properties of Silicon Thin-Film Electrode", Journal of Power Sources, 161(2), 1254-1259 (2006).

Colinge, Jean-Pierre, "Silicon-on-Insulator Technology: Materials to VLSI", Chapter 2, SOI Materials, (1991), Cover page and p. 38.

Deal et al., "General Relationship for the Thermal Oxidation of Silicon", Journal of Applied Physics, vol. 36, No. 12, (Dec. 1965) 3770-3778.

El Ouatani et al., "The Effect of Vinylene Carbonate Additive on Surface Film Formation on Both Electrodes in Li-Ion Batteries", J. Electrochem. Soc., 156(2), A103-A113 (2009).

Feng et al., "Lithography-Free Silicon Micro-Pillars as Catalyst Supports for Microfabricated Fuel Cell Applications", Electrochemistry Communications, 8 (2006) 1235-1238.

(56) References Cited

OTHER PUBLICATIONS

Green et al., "Mesoscopic Hemisphere Arrays for use as Resist in Solid State Structure Fabrication", J. Vac. Sci. Technol. B 17(5) (1999) 2074-2083.

Green et al., "Quantum Pillar Structures on n+ Gallium Arsenide Fabricated Using "Natural" Lithography", Appl. Phys. Lett., 62 (3) (1993) 264-266.

Green et al., "Structured Silicon Anodes for Lithium Battery Applications", Electrochemical and Solid-State Letters, 6 (5) (2003) A75-A79.

Han et al., "Neutralized Poly (Acrylic Acid) as Polymer Binder for High Capacity Silicon Negative Electrodes", $220^{th}$ ECS Meeting, Abstract #1250 (2011).

Heinze et al., "Viscosity Behaviour of Multivalent Metal Ion-Containing Carboxymethyl Cellulose Solutions", Die Angewandte Makromolekulare Chamie 220, 123-132, (Nr. 3848), (1994).

Hochgatterer et al., "Silicon/Graphite Composite Electrodes for High Capacity Anodes: Influence of Binder Chemistry on Cycling Stability", Electrochemical and Solid-State Letters, 11 (5) (2008) A76-A80.

Huggins, Robert A., "Lithium Alloy Anodes" in Handbook of Battery Materials, J.O. Besenhard Ed., Wiley-VCH, Weinheim, 361-381 (1999).

Ivanovskaya et al., "The Effect of Treatment of Cation-Selective Glass Electrodes With AgNO3 Solution on Electrode Properties", Sensors and Actuators B 24-25 (1995) 304-308.

Jianfeng et al., "Large-Scale Array of Highly Oriented Silicon-Rich Micro/Nanowires Induced by Gas Flow Steering", Solid State Communications, 133 (2005) 271-275.

Kasavajjula et al., "Nano- and Bulk-Silicon-Based Insertion Anodes for Lithium-Ion Secondary Cells", Journal of Power Sources, 163 (2007) 1003-1039.

Key to Metal Aluminum-Silicon Alloys, www.keytometals.com/Article80.

Kim et al., "(110) Silicon Etching for High Aspect Ratio Comb Structures", 1997 6th International Conference on Emerging Technologies and Factory Automation Proceedings, (1997) 248-252.

Kim et al., "Improvement of Silicon Powder Negative Electrodes by Copper Electroless Deposition for Lithium Secondary Batteries", Journal of Power Sources, 147 (2005) 227-233.

Kleimann et al., "Formation of Wide and Deep Pores in Silicon by Electrochemical Etching", Materials Science and Engineering, B69-70 (2000) 29-33.

Kolasinski, Kurt W., "Silicon Nanostructures from Electroless Electrochemical Etching", Current Opinion in Solid State and Materials Science, 9 (2005) 73-83.

Komba et al., "Functional Interface of Polymer Modified Graphite Anode", Journal of Power Sources, 189, (2009), 197-203.

Komba et al., "Polyacrylate as Functional Binder for Silicon and Grapite Composite Electrode in Lithium-Ion Batteries", Electrochemistry, 79(1), (2010), 6-9.

Komba et al., "Polyacrylate Modifier for Graphite Anode of Lithium-Ion Batteries", Electrochemical and Solid-State Letters, 12(5), (2009), A107-A110.

Komba et al., "Study on Polymer Binders for High-Capacity SiO Negative Electrode of Li-Ion Batteries", Journal of Physical Chemistry, 115, (2011), 13487-13495.

Lang, Walter, "Silicon Microstructuring Technology", Materials Science and Engineering, R17 (1996) 1-55.

Lee et al., "Effect of Poly (Acrylic Acid) on Adhesion Strength and Electrochemical Performance of Natural Graphite Negative Electrode for Lithium-Ion Batteries", Journal of Power Sources, 161(1), (2006), 612-616.

Li et al., "A High Capacity Nano-Si Composite Anode Material for Lithium Rechargeable Batteries", Electrochemical and Solid-State Letters, 2 (11) (1999) 547-549.

Li et al., "Sodium Carboxymethyl Cellulose: A Potential Binder for Si Negative Electrodes for Li-Ion Batteries", Electrochemical and Solid-State Letters, 10(2) (2007), A17-A20.

Li et al., "The Crystal Structural Evolution of Nano-Si Anode Caused by Lithium Insertion and Extraction at Room Temperature", Solid State Ionics, 135 (2000) 181-191.

Liu et al., "A Novel Method of Fabricating Porous Silicon Material: Ultrasonically Enhanced Anodic Electrochemical Etching", Solid State Communications, 127 (2003) 583-588.

Liu et al., "Effect of Electrode Structure on Performance of Si Anode in Li-Ion Batteries: Si Particle Size and Conductive Additive", Journal of Power Source, 140 (2005) 139-144.

Liu et al., "Enhanced Cycle Life of Si Anode for Li-Ion Batteries by Using Modified Elastomeric Binder", Electrochemical and Solid-State Letters, 8(2) (2005), A100-A103.

Lu et al., "A Study of the Mechanisms of Erosion in Silicon Single Crystals Using Hertzian Fracture Tests", Wear, 186-187 (1995) 105-116.

Maranchi et al., "Interfacial Properties of the a-Si/Cu: Active-Inactive Thin-Film Anode Systems for Lithium-Ion Batteries", Journal of the Electrochemical Society: 153 (6) (2006) A1246-A1253.

Nakahata et al., "Fabrication of Lotus-Type Porous Silicon by Unidirectional Solidification in Hyrdogen", Materials Science and Engineering A 384 (2004) 373-376.

Niparko, J.K. (Editor), "Cochlear Implant Technology", Pub., Lippincott Williams and Wilkins, Philadelphia, (2000) 108-121.

Obrovac et al., "Structural Changes in Silicon Anodes During Lithium Insertion/Extraction", Electrochemical and Solid-State Letters, 7(5), (2004), A96-A96.

Ohara et al., "A Thin Film Silicon Anode for Li-Ion Batteries Having a Very Large Specific Capacity and Long Cycle Life", Journal of Power Sources, 136 (2004) 303-306.

Pei et al., "Silicon Nanowires Grown from Silicon Monoxide Under Hydrothermal Conditions", Journal of Crystal Growth, 289 (2006) 423-427.

Peng et al., "Dendrite-Assisted Growth of Silicon Nanowires in Electroless Metal Deposition", Adv. Funct. Mater., 13, No. 2 (2003) 127-132.

Peng et al., "Fabrication of Large-Area Silicon Nanowire p-n Junction Diode Arrays", Adv. Mater. (2004), vol. 16, No. 1, 73-76.

Peng et al., "Silicon Nanowires for Rechargeable Lithium-ion Battery Anodes", Applied Physics Letters (2008) vol. 93, No. 3, pp. 33105-1 to 33105-3.

Peng et al., "Simultaneous Gold Deposition and Formation of Silicon Nanowire Arrays", Journal of Electroanalytical Chemistry, 558 (2003) 35-39.

Peng et al., "Synthesis of Large-Area Silicon Nanowire Arrays via Self-Assembling Nanoelectrochemistry", Adv. Mater., 14, No. 16 (2002) 1164-1167.

Peng et al., "Uniform, Axial-Orientation Alignment of One-Dimensional Single-Crystal Silicon Nanostructure Arrays", Angew. Chem. Ind. Ed., 44 (2005) 2737-2742.

Peng, et al., "Fabrication of Single-Crystalline Silicon Nanowires by Scratching a Silicon Surface with Catalytic Metal Particles", Adv. Funct. Mater., 16 (2006), 387-394.

Qiu et al., "From Si Nanotubes to Nanowires: Synthesis, Characterization, and Self-Assembly", Journal of Crystal Growth, 277 (2005) 143-148.

Qiu et al., "Self-Assembled Growth and Optical Emission of Silver-Capped Silicon Nanowires", Applied Physics Letters, vol. 84, No. 19, (2004) 3867-3869.

Sharma et al., "Thermodynamic Properties of the Lithium-Silicon System", J. Electrochem. Soc.: Electrochemical Science and Technology, vol. 123 (1976) 1763-1768.

Shin et al., "Porous Silicon Negative Electrodes for Rechargeable Lithium Batteries", Journal of Power Sources, 139 (2005) 314-320.

Sugama, et al., "Nature of Interfacial Interaction Mechanisms Between Polyacrylic Acid Macromolecules and Oxide Metal Surfaces", Journal of Materials Science, 19 (1984) 4045-4056.

Tokoro et al., "Anisotropic Etching Properties of Silicon in KOH and TMAH Solutions", Proceedings of the 1998 International Symposium on Micromechatronics and Human Science (1998) 65-70.

Tsuchiya et al., "Structural Fabrication Using Cesium Chloride Island Arrays as a Resist in a Fluorocarbon Reactive Ion Etching Plasma", Electrochemical and Solid-State Letters, 3 (1) (2000) 44-46.

(56) References Cited

OTHER PUBLICATIONS

Ui et al., "Improvement of Electrochemical Characteristics of Natural Graphite Negative Electrode Coated With Polyacrylic Acid in Pure Propylene Carbonate Electrolyte", Journal of Power Sources, 173(1), (2007), 518-521.

Wagner et al., "Vapor-Liquid-Solid Mechanism of Single Crystal Growth", Applied Physics Letters, vol. 4, No. 5 (1964) 89-90.

Wen et al., "Chemical Diffusion in Intermediate Phases in the Lithium-Silicon System", Journal of Solid State Chemistry, 37 (1981) 271-278.

Weydanz et al., "A Room Temperature Study of the Binary Lithium-Silicon and the Ternary Lithium-Chromium-Silicon System for use in Rechargeable Lithium Batteries", Journal of Power Sources, 81-82 (1999) 237-242.

Winter, et al., "Insertion Electrode Materials for Rechargeable Lithium Batteries", Advanced Materials, 1998, 10, No. 10.

Wong et al., "Controlled Growth of Silicon Nanowires Synthesized Via Solid-Liquid-Solid Mechanism", Science and Technology of Advanced Materials, 6 (2005) 330-334.

Yabuuchi et al., "Graphite-Silicon-Polyacrylate Negative Electrodes in Ionic Liquid Electrolyte for Safer Rechargeable Li-Ion Batteries", Advanced Energy Materials, 1, (2011), 759-765.

Yan et al., "Growth of Amorphous Silicon Nanowires via a Solid-Liquid-Solid Mechanism", Chemical Physics Letters, 323 (2000) 224-228.

Yan et al., "$H_2$-Assisted Control Growth of Si Nanowires", Journal of Crystal Growth, 257 (2003) 69-74.

Yoshio et al., "Electrochemical Behaviors of Silicon Based Anode Material", Journal of Power Sources, 153 (2006) 375-379.

Zhang et al., "A Review on Electrolyte Additives for Lithium-Ion Batteries", Journal of Power Sources, 162(2), 1379-1394, (2006).

Zhang et al., "Bulk-Quantity Si Nanowires Synthesized by SiO Sublimation", Journal of Crystal Growth, 212 (2000) 115-118.

Zhang et al., "Catalytic Growth of $^x$-$FiSi_2$ and Silicon Nanowires", Journal of Crystal Growth, 280 (2005) 286-291.

Zhang et al., "Synthesis of Thin Si Whiskers (Nanowires) Using $SiCl_4$", Journal of Crystal Growth, 2006 (2001) 185-191.

International Search Report of PCT/GB2007/000211 dated Apr. 24, 2007.

Written opinion of PCT/GB2007/000211 dated Apr. 24, 2007.

De Angelis et al., "Water Soluble Nanoporous Nanoparticles for In Vivo Targeted Drug Deliver and Controlled Release in B Cells Tumor Context", Nanoscale, 2010, vol. 2, p. 2230-2236.

Garrido, et al., The Role of Chemical Species in the Passivation of <100> Silicon Surfaces by HF in Water-Ethanol Solutions, J. Electrochem Soc., vol. 143, No. 12, 1996, p. 4059-4066.

Russo, et al., "A Mechanical Approach to Porous Silicon Nanoparticles Fabrication", Materials 2011, vol. 4, p. 1023-1033.

Takami et al., "Silicon Fiber Formed on Silicon Without Using a Gas Process", Journal of Applied Physics, vol. 91, No. 12, 2-5 (2002).

Ye et al., Controllable Growth of Silver Nanostructures by a Simple Replacement Reaction and Their SERS Studies, Solid State Sciences 11 (2009), p. 1088-1093.

Hong et al., "The Crystal Structural Evolution of Nano-Si Anode Caused by Lithium Insertion and Extraction at Room Temperature", Solid State Ionics, 135 (2000), pp. 181-191.

\* cited by examiner

METHOD OF FABRICATING FIBRES COMPOSED OF SILICON OR A SILICON-BASED MATERIAL AND THEIR USE IN LITHIUM RECHARGEABLE BATTERIES

This application is a continuation of U.S. Ser. No. 12/161,126 which was filed on Feb. 25, 2010 now U.S. Pat. No. 8,101,298. That application, in turn, was the entry into the national phase in the United States of International Application No. PCT/GB2007/000211 which was filed on Jan. 23, 2007. The International Application claims priority to British Application No. 0601319.7 which was filed on Jan. 23, 2006.

The invention relates to a method of fabricating fibres composed of silicon or a silicon-based material and their use the active anode material in rechargeable lithium battery cells.

It is well known that silicon can be used as the active anode material of a rechargeable lithium-ion electrochemical cell (see, for example, Insertion Electrode Materials for Rechargeable Lithium Batteries, M. Winter, J. O. Besenhard, M. E. Spahr, and P. Novak in Adv. Mater. 1998, 10, No. 10). The basic composition of a conventional lithium-ion rechargeable battery cell is shown in FIG. 1 including a graphite-based anode electrode, the component to be replaced by the silicon-based anode. The battery cell includes a single cell but may also include more than one cell.

The battery cell generally comprises a copper current collector for the anode 10 and an aluminium current collector for the cathode 12 which are externally connectable to a load or to a recharging source as appropriate. A graphite-based composite anode layer 14 overlays the current collector 10 and a lithium containing metal oxide-based composite cathode layer 16 overlays the current collector 12. A porous plastic spacer or separator 20 is provided between the graphite-based composite anode layer 14 and the lithium containing metal oxide-based composite cathode layer 16 and a liquid electrolyte material is dispersed within porous plastic spacer or separator 20, the composite anode layer 14 and the composite cathode layer 16. In some cases, the porous plastic spacer or separator 20 may be replaced by a polymer electrolyte material and in such cases the polymer electrolyte material is present within both the composite anode layer 14 and the composite cathode layer 16.

When the battery cell is fully charged, lithium has been transported from the lithium containing metal oxide via the electrolyte into the graphite-based layer where it reacts with the graphite to create the compound, $LiC_6$. The graphite, being the electrochemically active material in the composite anode layer, has a maximum capacity of 372 mAh/g. It will be noted that the terms "anode" and "cathode" are used in the sense that the battery is placed across a load.

It is generally believed that silicon, when used as an active anode material in a lithium-ion rechargeable cell, provides a significantly higher capacity than the currently used graphite. Silicon when converted to the compound $Li_{21}Si_5$ by reaction with lithium in an electrochemical cell, has a capacity of 4,200 mAh/g.

Existing approaches of using a silicon or silicon-based active anode material in a lithium-ion electrochemical cell have failed to show sustained capacity over the required number of charge/discharge cycles and are thus not commercially viable.

One approach uses silicon in the form of a powder, in some instances made into a composite with optionally an electronic additive and containing an appropriate binder such as polyvinylidene difluoride coated onto a copper current collector. However, this electrode fails to show sustained capacity when subjected to charge/discharge cycles. It is believed that this capacity loss is due to partial mechanical isolation of the silicon powder mass arising from the volumetric expansion/contraction associated with lithium insertion/extraction into and from the host silicon. In turn this gives rise to agglomeration of the powder mass in electrically isolated "islands".

In another approach described by Ohara et al. in Journal of Power Sources 136 (2004) 303-306 silicon is evaporated onto a nickel foil current collector as a thin film and this structure is then used to form the anode of a lithium-ion cell. However, although this approach gives good capacity retention, this is only the case for very thin films and thus these structures do not give usable amounts of capacity per unit area and increasing the film thickness to give usable amounts of capacity per unit area causes the good capacity retention to be eliminated.

In another approach described in U.S. 2004/0126659 silicon is evaporated onto nickel fibres which are then used to form the anode of a lithium battery. However this is found to provide an uneven distribution of silicon on the nickel fibres hence significantly affecting operation.

In another approach described in U.S. Pat. No. 6,887,511, silicon is evaporated onto a roughened copper substrate to create medium-thickness films of up to 10 μm. During the initial lithium ion insertion process, the silicon film breaks up to form pillars of silicon. These pillars can then reversibly react with lithium ions and good capacity retention is achieved. However, the process does not function well with thicker film and the creation of the medium-thickness film is an expensive process. Furthermore the pillared structure caused by the break up of the film has no inherent porosity such that issues may arise with long term capacity retention.

The invention is set out in the claims. Because the anode electrode structure uses fibres of silicon or silicon-based material, the problems of reversibly reacting these silicon or silicon-based fibres with lithium are overcome. In particular by arranging the fibres in a composite structure, that is a mixture of fibres a polymer binder and an electronic additive, the charge/discharge process becomes reversible and repeatable and good capacity retention is achieved. In addition the manner in which the fibres are laid can provide advantages. By providing a dis-ordered non-woven mat of fibres, a fully reversible and repeatable charging capability is introduced without risk of significant mechanical isolation. For example the fibres may be deposited as a felt or felt-like structure. In the case of a composite structure this can be with the additional components, or the felt can be with a simple binder or, where structurally appropriate, loose.

Furthermore, a simplified method of fabricating fibres is provided comprising etching a substrate to produce pillars and detaching the pillars providing a robust and high-yield approach.

Embodiments of the invention will now be described, by way of example, with reference to the figures, of which:

Figure 1:
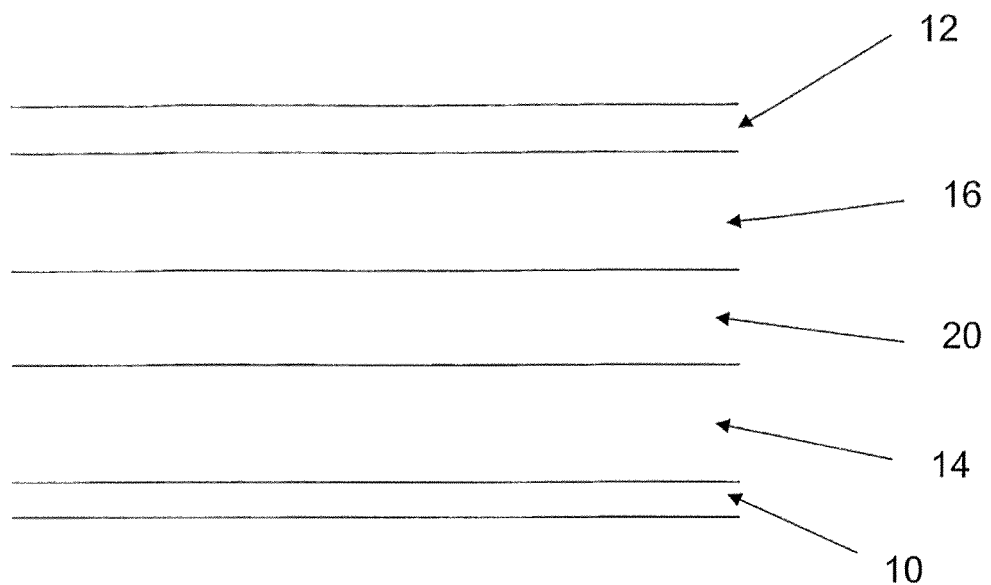
FIG. 1 is a schematic diagram showing the components of a battery cell.

In overview the invention allows creation of fibres or hairs of silicon or silicon-based material and the use of these fibres to create both a composite anode structure with a polymer binder, an electronic additive (if required) and a metal foil current collector and a felt-like electrode structure. In particular it is believed that the structure of the silicon elements that make up the composite overcomes the problem of charge/discharge capacity loss.

By laying down the fibres in a composite or felt or a felt-like structure, that is a plurality of elongate or long thin fibres which crossover to provide multiple intersections, for example by being laid down in a random or disordered or indeed ordered manner, the problem of charge/discharge capacity loss is reduced.

Typically the fibres will have a length to diameter ratio of approximately 100:1 and hence in an anode layer such as a composite anode layer, each fibre will contact other fibres many times along their length giving rise to a configuration where the chance of mechanical isolation arising from broken silicon contacts is negligible. Also, the insertion and removal of lithium into the fibres, although causing volume expansion and volume contraction, does not cause the fibres to be destroyed and hence the intra-fibre electronic conductivity is preserved.

The fibres may be manufactured by detaching pillars from a substrate. In addition the manner of fabrication of the pillars may be provided by a simple repeatable chemical process.

One manner in which the pillars can be made is by dry etching, for example deep reactive ion etching of the type, for example, described in U.S. patent application Ser. No. 10/049,736 which is commonly assigned herewith and incorporated herein by reference. The skilled person will be familiar with the process such that detailed description is not required here. Briefly, however, a silicon substrate coated in native oxide is etched and washed so as to give a hydrophilic surface. Caesium chloride (CsCl) is evaporated on the surface and the coated substrate is transferred under dry conditions to a chamber of fixed water vapour pressure. A thin film of CsCl develops into an island array of hemispheres whose dimensional characteristics depend on initial thickness, water vapour pressure and time of development. The island array provides an effective mask after which etching is carried out for example by reactive ion etching leaving an array of pillars corresponding to the hemispherical islands. The CsCl resist layer is highly soluble in water and can be readily washed away.

Alternatively the pillars can be made by wet etching/using a chemical galvanic exchange method for example as described in our co-pending application GB 0601318.9 with common assignees and entitled "Method of etching a silicon-based material", incorporated herewith by reference. A related method which may also be used has been disclosed in Peng K-Q, Yan, Y-J Gao, S-P, Zhu J., Adv. Materials, 14 (2004), 1164-1167 ("Peng"); K. Peng et al, Angew. Chem. Int. Ed., 44 2737-2742; and K. Peng et al., Adv. Funct. Mater., 16 (2006), 387-394.

In the preferred embodiment pillars of for example 100 microns in length and 0.2 microns in diameter are fabricated on and from a silicon substrate. More generally pillars of length in the range of 20 to 300 microns and diameter or largest transverse dimension in the range of 0.08 to 0.5 microns may be used to provide the fibres. According to the process the silicon substrate may be n- or p-type and, according to the chemical approach, and may be etched on any exposed (100) or (110) crystal face. Since the etching proceeds along crystal planes, the resulting fibres are single crystals. Because of this structural feature, the fibres will be substantially straight facilitating length to diameter ratio of approximately 100:1 (aspect ratio) and, when in a composite anode layer, allowing each fibre to contact other fibre many times along their length. The etching process can also be carried out either o very large scale integration (VLSI) electronic grade wafers or rejected samples of the same (single crystal wafers). As a cheaper alternative, photovoltaic grade polycrystalline material, as used for solar panels, may also be used.

In order to detach the pillars to obtain the fibres, the substrate, with pillars attached, is placed in a beaker or any appropriate container, covered in an inert liquid such as ethanol and subjected to ultra-sonic agitation. It is found that within several minutes the liquid is seen to be turbid and it can be seen by electron microscope examination that at this stage the pillars have been removed from their silicon base.

It will be appreciated that alternative methods for "harvesting" the pillars include scraping the substrate surface to detach them or detaching them chemically. One chemical approach appropriate to n-type silicon material comprises etching the substrate in an HF solution in the presence of backside illumination of the silicon wafer.

Once the silicon pillars have been detached they can be used as the active material in a composite anode for lithium-ion electrochemical cells. To fabricate a composite anode, the harvested silicon is filtered from solution and can be mixed with polyvinylidene difluoride and made into a slurry with a casting solvent such as n-methyl pyrrolidinone. This slurry can then be applied or coated onto a metal plate or metal foil or other conducting substrate for example physically with a blade or in any other appropriate manner to yield a coated film of the required thickness and the casting solvent is then evaporated from this film using an appropriate drying system which may employ elevated temperatures in the range of 50 degrees C. to 140 degrees C. to leave the composite film free or substantially from casting solvent. The resulting mat or composite film has a porous and/or felt-like structure in which the mass of silicon fibres is typically between 70 percent and 95 percent. The composite film will have a percentage pore volume of 10-30 percent, preferably about 20 percent.

Figure 2:
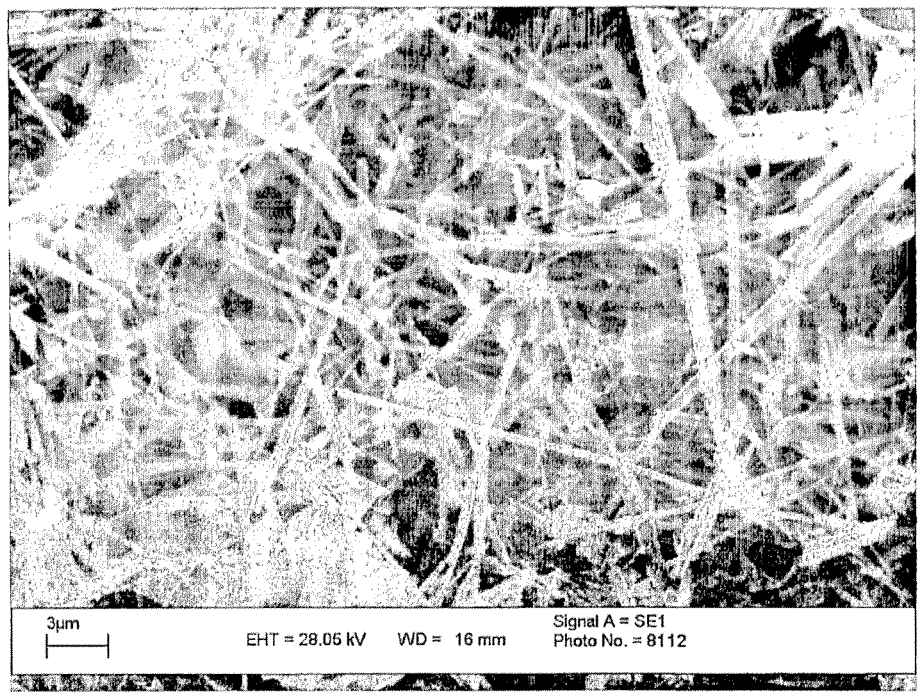
FIG. 2 is a magnified photograph of an electrode according to the present invention.

An SEM of a composite electrode structure obtain d by the method set out above is shown in FIG. 2. Alternatively a felt or felt-like structure may be produced as a sheet material (not necessarily on a current collector) and act as its own current collector.

Fabrication of the lithium-ion battery cell thereafter can be carried out in any appropriate manner for example following the general structure shown in FIG. 1 but with a silicon or silicon based active anode material rather than a graphite active anode material. For example the silicon fibres-based composite anode layer is covered by the porous spacer 18, the electrolyte added to the final structure saturating all the available pore volume. The electrolyte addition is done after placing the electrodes in an appropriate casing and may include vacuum filling of the anode to ensure the pore volume is filled with the liquid electrolyte.

Please see the following examples:

0.0140 g of silicon fibres were weighed out into a 2 cm$^2$ Eppendorf centrifuge tube, and 0.0167 g of Super P conductive carbon was added. N-methyl pyrrolidinone (NMP) was then pipetted into the tube, until all the materials were dispersed (0.92 g). Previously, PVDF had been dissolved in NMP, at 7.8 wt % PVDF. A quantity of this solution was added to the tube, containing 0.0074 g of PVDF. The mix composition was thus Si:PVDF:Super P=85.3:4.5:10.1 wt %.

The tube was placed in an ultrasonic bath for one hour, to homogenise the mixture, and then stirred for a further hour. The slurry was then coated onto 14 μm copper foil, using a doctor blade with a blade gap of 0.8 mm. The coating was then dried in an oven at 100° C. for one hour, to evaporate the NMP solvent. After drying, the thickness of the coated layer was 30-40 µm. FIG. 2 shows an SEM of a similar mix and coating, with no Super P carbon.

Figure 3:
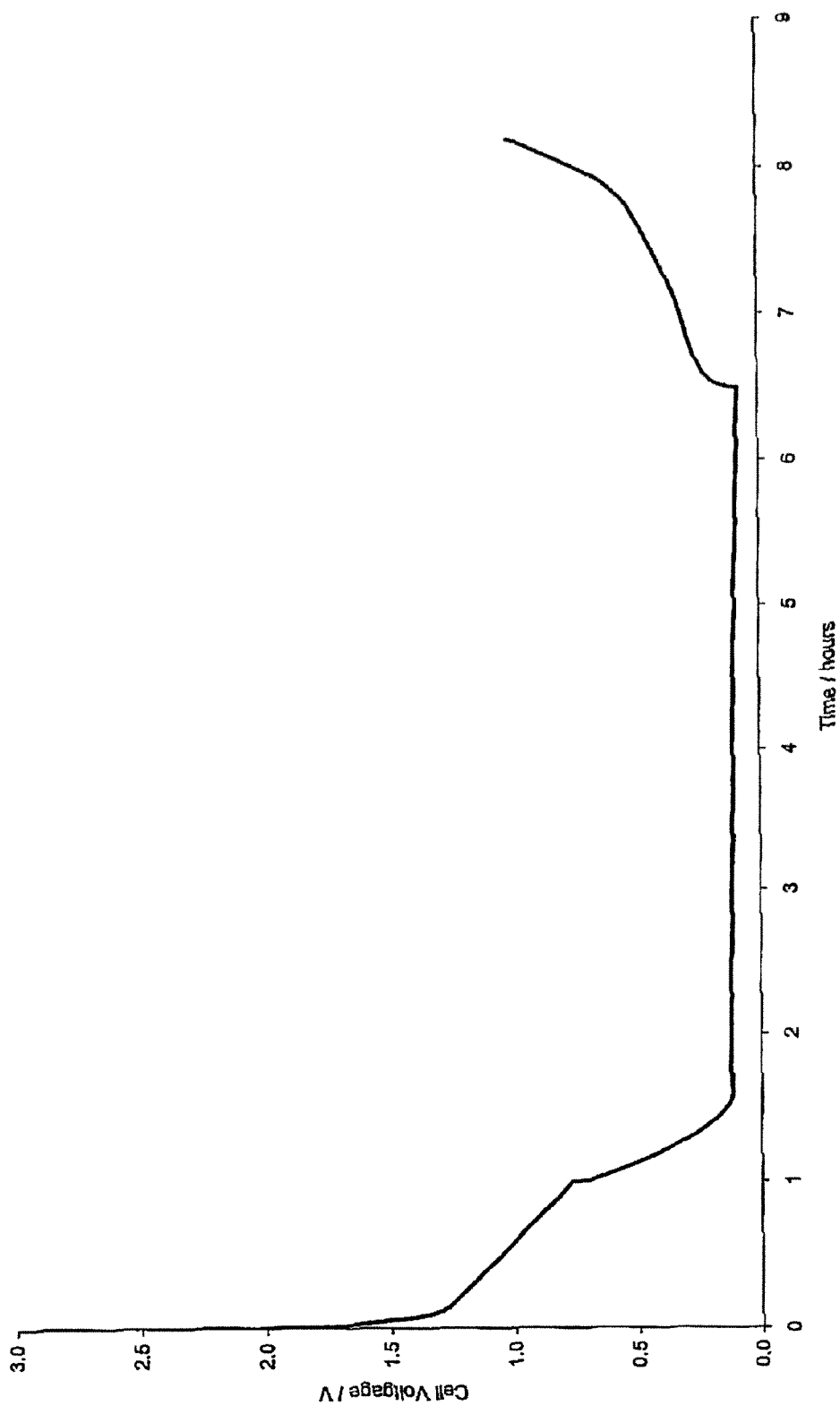
FIG. 3 shows a first cycle voltage plot for a silicon fibre/PVDF/Super P composite electrode.

The coating was lightly rolled, and then electrode disks were cut out with a diameter of 12 mm. These were assembled into electrochemical cells in an argon filled glove box. The counter electrode and reference electrode were both lithium metal. The electrolyte was $LiPF_6$ in a mixture of organic carbonates. The cell was tested on a VMP3 device. After a thirty minute soak, the cell was held at −0.1 mA for one hour, and then at −0.2 mA until the required lithiation capacity was achieved. The electrode was then delithiated at +0.2 mA, up to a voltage of 1.0 V vs. $Li/Li^+$. FIG. 3 shows the cell voltage during this first cycle.

A particular advantage of the approach described herein is that large sheets of silicon-based anode can be fabricated, rolled if necessary, and then slit or stamped out subsequently as is currently the case in graphite-based anodes for lithium-ion battery cells meaning that the approach described herein can be retrofitted with the existing manufacturing capability.

A further advantage of the arrangement described herein is that the structural strength in fact increases with each recharging operation. This is because the fibres are found to "weld" to one another as a result of the disrupted crystalline structure at the fibre junctions creating an amorphous structure. This in turn reduces the risk of capacity loss over multiple cycles as there is less risk of mechanical isolation of the fibres once the fibres become connected in the manner described above.

It will be appreciated, of course, that any appropriate approach can be adopted in order to arrive at the approaches and apparatus described above. For example the pillar detaching operation can comprise any of a shaking, scraping, chemical or other operation as long as pillars are removed from the substrate to create fibres. Reference to silicon-based material includes silicon where appropriate. The fibres can have any appropriate dimension and can for example be pure silicon or doped silicon or other silicon-based material such as a silicon-germanium mixture or any other appropriate mixture. The substrate from which pillars are created may be n- or p-type, ranging from 100 to 0.001 Ohm cm, or it may be a suitable alloy of silicon, for example $Si_xGe_{1-x}$. The fibres can be used for any appropriate purpose such as fabrication of electrodes generally including cathodes. The cathode material can be of any appropriate material, typically a lithium-based metal oxide or phosphate material such as $LiCoO_2$, $LiMn_xNi_xCo_{1-2x}O_2$ or $LiFePO_4$. The features of different embodiments can be interchanged or juxtaposed as appropriate and the method steps performed in any appropriate order.

The invention claimed is:

1. An electrode for an electrochemical cell, the electrode comprising an electrically interconnected mass comprising:
   elongated structures, wherein the elongated structures are capable of being reversibly charged and discharged and at least some of the elongated structures cross over each other to provide intersections and a porous structure, and wherein the elongated structures comprise silicon;
   at least one of a binder and an electronic additive;
   wherein the elongated structures and the at least one of the binder and the electronic additive cooperate to define a porous composite electrode layer.

2. An electrode as claimed in claim 1 wherein the elongated structures have a resistivity of 100 to 0.001 Ohm cm.

3. An electrode as claimed in claim 1 wherein at least some of the elongated structures are arranged in a random or disordered manner.

4. An electrode as claimed in claim 1 wherein the structures comprise doped silicon.

5. An electrode as claimed in claim 1 wherein the composite layer has a percentage pore volume of about 10-30 percent.

6. An electrode as claimed in claim 1 wherein the elongated structures have a transverse dimension in the range 0.08 to 0.5 microns and/or a length in the range of 20 to 300 microns.

7. An electrode as claimed in claim 1 wherein the mass of silicon in the electrically interconnected mass is 70 to 95 percent.

8. An electrode as claimed in claim 1 wherein the intersections comprise a disrupted crystalline or amorphous structure.

9. An electrode as claimed in claim 1 wherein the elongated structures comprise n-type or p-type silicon.

10. An electrode as claimed in claim 1 wherein the elongated structures have a resistivity of 100 to 0.001 Ohm cm.

11. An electrode as claimed in claim 1 wherein the elongated structures have an aspect ratio of greater than 40:1.

12. An electrode as claimed in claim 1 wherein the elongated structures are substantially straight.

13. An electrode as claimed in claim 1 arranged to form a lithium-ion battery with a second electrode and an electrolyte, wherein the electrolyte at least partially fills pores of the porous composite electrode layer.

14. An electrode for an electrochemical cell, the electrode comprising an electrically interconnected mass comprising:
   elongated structures, wherein the elongated structures are electrochemically active such that they are capable of lithium insertion and removal and at least some of the elongated structures cross over each other to provide intersections and a porous structure, and wherein the elongated structures comprise silicon;
   wherein the electrically interconnected mass has a percentage pore volume of about 10-30 percent.

15. An electrode as claimed in claim 14 wherein the elongated structures comprise n-type or p-type silicon.

16. An electrode as claimed in claim 14 wherein the elongated structures have a resistivity of 100 to 0.001 Ohm cm.

17. An electrode as claimed in claim 14 wherein the elongated structures have an aspect ratio of greater than 40:1.

18. An electrode as claimed in claim 14 wherein the elongated structures are straight.

19. An electrode as claimed in claim 14 arranged to form a lithium-ion battery with a second electrode and an electrolyte, wherein the electrolyte at least partially fills pores of the porous composite electrode layer.

20. An electrode for an electrochemical cell, the electrode comprising:
   elongated structures, wherein at least some of the elongated structures cross over each other to provide intersections and a porous structure, wherein the elongated structures comprise silicon;
   wherein the intersections comprise a disrupted crystalline or amorphous structure which welds the elongated structures to one another.

21. An electrode as claimed in claim 20 wherein the elongated structures comprise n-type or p-type silicon.

22. An electrode as claimed in claim 20 wherein the elongated structures have a resistivity of 100 to 0.001 Ohm cm.

23. An electrode as claimed in claim 20 wherein the silicon comprising fibers have an aspect ratio of greater than 40:1.

24. An electrode as claimed in claim 20 wherein the elongated structures are straight.

25. An electrode as claimed in claim 20 arranged to form a lithium-ion battery with a second electrode and an electrolyte, wherein the electrolyte at least partially fills pores of the porous composite electrode layer.

* * * * *